(12) United States Patent  
Wieland et al.

(10) Patent No.: US 8,604,411 B2  
(45) Date of Patent: Dec. 10, 2013

(54) CHARGED PARTICLE BEAM MODULATOR

(75) Inventors: Marco Jan-Jaco Wieland, Delft (NL); Remco Jager, Rotterdam (NL); Alexander Hendrik Vincent Van Veen, Rotterdam (NL); Stijn Willem Herman Karel Steenbrink, Den Haag (NL); Teunis van de Peut, Leusden (NL); Henk Derks, Waalre (NL)

(73) Assignee: Mapper Lithography IP B.V., Delft (NL)

(*) Notice: Subject to any disclaimer, the term of this patent is extended or adjusted under 35 U.S.C. 154(b) by 206 days.

(21) Appl. No.: 13/295,252

(22) Filed: Nov. 14, 2011

(65) Prior Publication Data

US 2012/0292491 A1    Nov. 22, 2012

Related U.S. Application Data

(60) Provisional application No. 61/413,396, filed on Nov. 13, 2010, provisional application No. 61/414,544, filed on Nov. 17, 2010, provisional application No. 61/477,228, filed on Apr. 20, 2011, provisional application No. 61/479,263, filed on Apr. 26, 2011.

(51) Int. Cl.
*H01J 37/147* (2006.01)
*G21K 5/00* (2006.01)

(52) U.S. Cl.
USPC ... 250/216; 250/396 R; 250/398; 250/492.22; 250/492.3

(58) Field of Classification Search
USPC ............ 250/216, 221, 548, 396 R, 397, 398, 250/400, 492.2, 492.22, 492.3; 355/67, 71
See application file for complete search history.

(56) References Cited

U.S. PATENT DOCUMENTS 6,897,458 B2    5/2005    Wieland et al.
6,958,804 B2    10/2005   Wieland et al.
(Continued)

FOREIGN PATENT DOCUMENTS

EP     2214194 B1     8/2010
JP     2007019242 A2  1/2007
(Continued)

OTHER PUBLICATIONS

M. Wieland et al, "MAPPER: high throughput maskless lithography.", SPIE, PO Box10 Bellingham WA 98227-0010 USA, vol. 7271, Mar. 17, 2009.

(Continued)

*Primary Examiner* — Kevin Pyo
(74) *Attorney, Agent, or Firm* — Hoyng Monegier LLP; David P. Owen; Coraline J. Haitjema (57) ABSTRACT

The invention relates to a charged particle lithography system comprising a beam generator for generating a plurality of charged particle beamlets, a beam stop array and a modulation device. The beam stop array has a surface for blocking beamlets from reaching a target surface and an aperture array in the surface for allowing beamlets to reach the target surface. The modulation device is arranged for modulating the beamlets by deflecting or not deflecting the beamlets so that the beamlets are blocked or not blocked by the beam stop array. A surface area of the modulation device comprises an elongated beam area comprising an array of apertures and associated modulators, and a power interface area for accommodating a power arrangement for powering elements within the modulation device. The power interface area is located alongside a long side of the elongated beam area and extending in a direction substantially parallel thereto.

31 Claims, 7 Drawing Sheets

(56) References Cited

U.S. PATENT DOCUMENTS

| | | | |
|---|---|---|---|
| 7,019,908 B2 | 3/2006 | van't Spijker | |
| 7,084,414 B2 | 8/2006 | Wieland et al. | |
| 7,129,502 B2 | 10/2006 | Kruit | |
| 7,391,037 B2 * | 6/2008 | Kruit | 250/492.2 |
| 2004/0135983 A1 | 7/2004 | Wieland et al. | |
| 2009/0268184 A1 | 10/2009 | Lin et al. | |
| 2013/0043414 A1 * | 2/2013 | Rosenthal | 250/492.22 |

FOREIGN PATENT DOCUMENTS

| | | |
|---|---|---|
| WO | WO 2004038509 A2 | 5/2004 |
| WO | WO 2007032671 A1 | 3/2007 |
| WO | WO 2009127659 A2 | 10/2009 |

OTHER PUBLICATIONS

P. Kruit, "The Role of MEMS in Maskless Lithography.", Microelectronic Engineering, Elsevier Publishers B.V., Amsterdam, NL, vol. 84, No. 5-8, May 6, 2007, pp. 1027-1032.

H. C. Pfeiffer, "New Prospects for Electron Beams as Tools . . . ", SPIE, PO Box 10 Bellingham WA 98227-0010 USA, vol. 7378, May 22, 2009, pp. 737802-1-737802-12.

M. J. Wieland et al, "Throughput Enhancement Technique for MAPPER Maskless Lithography.", ip.com Journal, ip.com Inc., West Henrietta, NY, US, Feb. 10, 2010, ISSN 1533-0001.

* cited by examiner

CHARGED PARTICLE BEAM MODULATOR

BACKGROUND OF THE INVENTION

1. Field of the Invention

The invention relates to a charged particle lithography system for transferring a pattern onto the surface of a target. The invention further relates to a modulation device for use in a charged particle lithography system for patterning a plurality of charged particle beamlets in accordance with a pattern. Finally, the invention relates to a method of transferring a pattern on to a target surface using a charged particle lithography system.

2. Description of the Related Art

Charged particle lithography systems are known in the art, for example from U.S. Pat. No. 6,958,804 in the name of the applicant. This lithography system uses a plurality of electron beamlets to transfer a pattern to the target surface. It operates with a continuous radiation source or with a source operating at constant frequency. The pattern data are herein sent to the modulation device, also referred to as a blanker arrangement and a beamlet blanker array. Herein, the beamlets are modulated by electrostatic deflection. The modulated beamlet is transferred to the target surface. In order to enable a high speed transfer of the pattern to the target surface, optical transmission of control signals from the control unit to the modulators is used. This transmission comprises conversion of the control signals into modulated light beams. The transmitted light beams are received by light sensitive elements and then converted to electric signals that go to one or more modulators. In order to enable the high speed e.g. high frequency modulation, the light sensitive elements are preferably located in the vicinity of the modulator it serves with control signals.

The semiconductor industry requires lithography systems to be upgraded, i.e. smaller critical pattern dimensions with sufficiently high throughput. The manufacture and alignment becomes more difficult with an increase in the density of the modulation device. Such higher density is required for upgrading the lithography systems to smaller critical dimensions and higher throughput. The number of beams in a charged particle system suitable for smaller critical dimensions may be in the order of thousands or tens of thousands.

For lithography purposes the area in which final projection occurs is typically limited to 27×27 mm. In a charged particle system where the electron beams remain substantially parallel this result in the area of the modulation device also being limited to 27×27 mm. Modulation of the substantially parallel electron beams requires a single modulator for each beam in the system.

Therefore, increasing the number of modulators requires that the pitch of the modulators is decreased. In the known system this decrease in pitch is limited by the area that the combination of modulator, light sensitive element and wiring for the electrical signals requires thus ultimately limiting the performance of the system. In order to enable the high speed e.g. high frequency modulation, simply relocating the light sensitive elements at a relatively large distance to the modulators is not an option. Furthermore, to ensure correct functioning of the modulator components and/or the light sensitive elements, power losses over the wires should be limited as well.

BRIEF SUMMARY OF THE INVENTION

It is therefore an object of the invention to provide a charged particle lithography system which can reliably operate with a high density of components in the modulation device. For this purpose, an embodiment of the invention provides a charged particle lithography system for transferring a pattern onto the surface of a target, comprising: a beam generator for generating a plurality of charged particle beamlets, the plurality of beamlets defining a column; a beam stop array having a surface for blocking beamlets from reaching the target surface and an array of apertures in the surface for allowing the beamlets to reach the target surface; and a modulation device for modulating the beamlets to prevent one or more of the beamlets from reaching the target surface or allow one or more of the beamlets to reach the target surface, by deflecting or not deflecting the beamlets so that the beamlets are blocked or not blocked by the beam stop array, the modulation device comprising: a plurality of apertures arranged in arrays for letting the beamlets pass through the modulation device; a plurality of modulators associated with the plurality of apertures, each modulator being provided with electrodes extending on opposing sides of an associated aperture for generating an electric field across the aperture; and a plurality of light sensitive elements arranged in arrays, for receiving modulated light beams and converting the light beams into electric signals for actuating the modulators; wherein a surface area of the modulation device comprises an elongated beam area comprising an array of apertures and associated modulators, and a power interface area for accommodating a power arrangement for suitably powering elements within the modulation device, the power interface area being located alongside a long side of the elongated beam area and extending in a direction substantially parallel thereto. The power interface area may extend along the entire length of the long side of the elongated beam area. In this manner the power supply lines on the modulation device remain relatively short and consequently the power drop thereover remains limited. Such limited power drop may for example improve the transformation of light signals into an electric signal. Further limitation of the length of the power supply lines may be achieved by using a power interface area comprises a first portion positioned alongside a first long side of the elongated beam area and extending in a direction substantially parallel thereto, and a second portion alongside a second long side of the elongated beam area and extending in a direction substantially parallel thereto, the second long side being opposite to the first long side.

Further improvement of light sensitive element performance, for example in view of reliable transformation of the light to an electric signal as mentioned above, may be achieved in a system where the surface area of the modulation device further comprises an optical interface area in which the light sensitive elements are placed, and the power arrangement is arranged for suitably powering the light sensitive elements. The optical interface area may have an elongated shape, and the optical interface area may then be located between the beam area and the power interface area. Modulated light beams may be guided towards the light sensitive elements via a plurality of optical fibers. The optical interface area may then be reserved for establishing an optical interface between the plurality of optical fibers and the light sensitive elements.

Preferably, the power arrangement extends in a direction substantially perpendicular to, and away from the modulation device. In this way, limited surface area of the modulation device is covered by the power arrangement. The power arrangement may comprise a ribbon cable or a slab. The use of a slab enables an equal and stable distribution of an electric potential, which leads to an equal current supply through the long side of the beam area.

In some embodiments of the invention, the surface area of the modulation device is subdivided into a plurality of alternating beam areas and non-beam areas, the modulators being located in the beam areas, and the light sensitive elements being located in the non-beam areas. The light sensitive elements in the non-beam areas are then communicatively coupled to the modulators in an adjacent beam area. The modulators in a beam area may be controllable by light sensitive elements arranged in non-beam areas located on more than one side of the beam area. Such arrangement may enable a further increase in modulator density.

In some embodiments, the system further includes a shielding structure for shielding electric fields generated within the non-beam areas, for example in the vicinity of a light sensitive element. The use of such shielding structure may improve the reliability of the beamlet modulation.

To enable reliable manufacturing with a high density of components, the modulators may be part of a CMOS (Complementary Metal Oxide Semiconductor) device. Electrodes of the modulators may then be part of the CMOS device, for example part of conductive layers therein.

The invention further relates to a modulation device for use in a charged particle lithography system for patterning a plurality of charged particle beamlets in accordance with a pattern, the beamlets defining a column, the modulation device serving to modulate the beamlets to prevent one or more of the beamlets from reaching the target surface or allow one or more of the beamlets to reach the target surface, by deflecting or not deflecting the beamlets, the modulation device comprising: a plurality of apertures arranged in arrays for letting the beamlets pass through the modulation device and a plurality of modulators associated with the plurality of apertures, each modulator being provided with electrodes extending on opposing sides of an associated aperture for generating an electric field across the aperture; and a plurality of light sensitive elements arranged in arrays, for receiving modulated light beams and converting the light beams into electric signals for actuating the modulators; wherein a surface area of the modulation device comprises an elongated beam area comprising an array of apertures and associated modulators, and a power interface area for accommodating a power arrangement for suitably powering elements within the modulation device, the power interface area being located alongside a long side of the elongated beam area and extending in a direction substantially parallel thereto. Examples of further embodiments of the modulation device are already discussed with reference to abovementioned lithography apparatus.

Finally, the invention relates to a method of transferring a pattern on to a target surface using a charged particle lithography system as described above. The method comprises the steps of: generating a plurality of beamlets defining a column; modulating the beamlets by deflecting or not deflecting the beamlets, for the purpose of completely or partly preventing the beamlets from reaching the target surface, under control of a control unit; transferring the passed beamlets to the target surface; wherein the modulating further comprises the steps of: optically transmitting data as modulated light beams carrying the pattern, to light sensitive elements; converting the modulated light beams received by the light sensitive elements into electric signals; actuating one or more modulators, on the basis of the electrical signals, to selectively deflect the beamlets for blocking or not blocking the beamlets from reaching the target surface, by means of deflection in an electric field.

BRIEF DESCRIPTION OF THE DRAWINGS

These and other objects of the invention will be further elucidated with reference to the figures, in which.

The figures are not drawn to scale and merely intended for illustrative purposes. Equal elements in different figures are referred to with same reference numerals.

Figure 1:
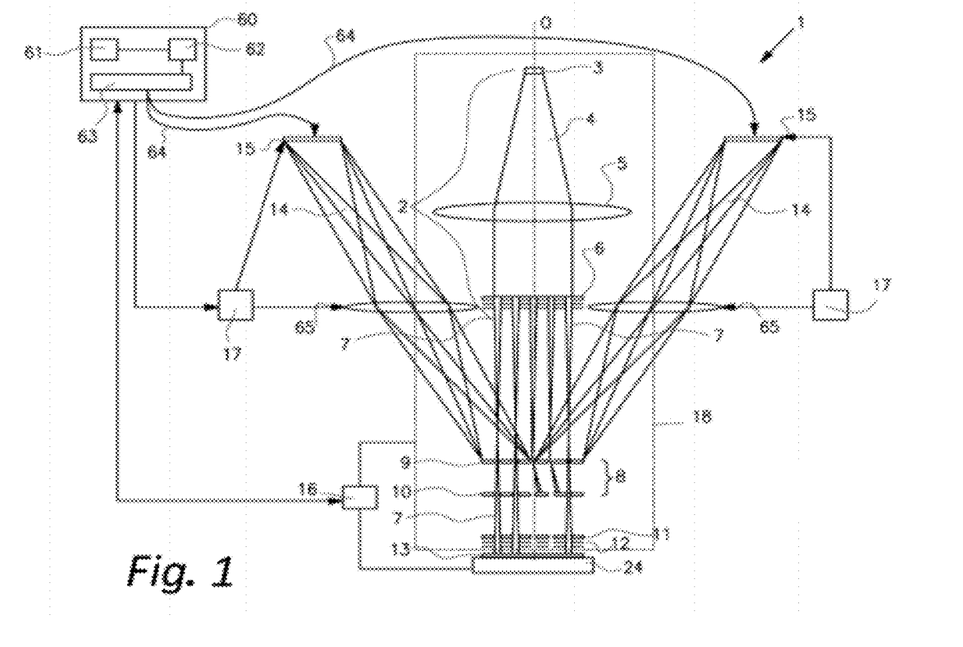
FIG. 1 shows diagrammatically the maskless lithography system in a first embodiment.

FIG. 1 shows a simplified schematic drawing of an embodiment of a charged particle multi-beamlet lithography system 1 based upon an electron beam optical system without a common cross-over of all the electron beamlets. Such lithography systems are described for example in U.S. Pat. Nos. 6,897,458 and 6,958,804 and 7,084,414 and 7,129,502, which are hereby incorporated by reference in their entirety, assigned to the owner if the present invention. Such a lithography system suitably comprises a beamlet generator generating a plurality of beamlets, a beamlet modulator patterning the beamlets into modulated beamlets, and a beamlet projector for projecting the beamlets onto a surface of a target. The beamlet generator typically comprises a source and at least one aperture array. The beamlet modulator is typically a beamlet blanker with a blanking deflector array and a beam stop array. The beamlet projector typically comprises a scanning deflector and a projection lens system. FIG. 1 does not show explicitly the positioning and support structure of the present invention.

In the embodiment shown in FIG. 1, the lithography system comprises an electron source 3 for producing a homogeneous, expanding electron beam 4. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 4 from the electron source 3 passes a double octopole and subsequently a collimator lens 5 for collimating the electron beam 4. As will be understood, the collimator lens 5 may be any type of collimating optical system. Subsequently, the electron beam 4 impinges on a beam splitter, which is in one suitable embodiment an aperture array 6. The aperture array 6 blocks part of the beam and allows a plurality of beamlets 7 to pass through the aperture array 6. The aperture array preferably comprises a plate having through-holes. Thus, a plurality of parallel electron beamlets 7 is produced. The system generates a large number of beamlets 7, preferably about 10,000 to 1,000,000 beamlets, although it is of course possible to use more or less beamlets. Note that other known methods may also be used to generate collimated beamlets. A second aperture array may be added in the system, so as to create subbeams from the electron beam 4 and to create electron beamlets 7 from the subbeam. This allows the manipulation of the subbeams, which turns out beneficial for the system operation, particularly when increasing the number of beamlets to 5,000 or more. Such manipulation is for instance carried out by a condenser lens, a collimator, a lens structure converging the subbeams to an optical axis, for instance in the plane of the projection lens.

The plurality of electron beamlets 7 pass through a condenser lens array—not shown in the figure—which focuses each of the electron beamlets 7 in the plane of an array of modulators 9. The modulators 9 may be part of a CMOS (Complementary Metal Oxide Semiconductor) device. Electrodes of the modulators may then be part of the CMOS device, for example part of conductive layers therein. The array of modulators 9 is particularly an beamlet blanker array and comprises a plurality of blankers, which are each capable of deflecting one or more of the electron beamlets 7. The blankers are more specifically electrostatic deflectors provided with a first and a second electrode, the second electrode being a ground electrode. The beamlet blanker array 9 constitutes with a beam stop array 10 a modulating means 8. On the basis of input from a control unit 60, the modulating means 8 add a pattern to the electron beamlets 7. The pattern will be positioned on the target surface 13 by means of components present within an end module.

In this embodiment, the beam stop array 10 comprises an array of apertures for allowing beamlets to pass through. The beam stop array, in its basic form, comprises a substrate provided with through-holes, typically round holes although other shapes may also be used. In one embodiment, the substrate of the beam stop array 8 is formed from a silicon wafer with a regularly spaced array of through-holes, and may be coated with a surface layer of a metal to prevent surface charging. In one embodiment, the metal is of a type that does not form a native-oxide skin.

In some embodiments, the passages of the beam stop array 10 are aligned with the elements of the beamlet blanker array 9. The beamlet blanker array 9 and the beamlet stop array 10 operate together to block or let pass the beamlets 7. If beamlet blanker array 9 deflects a beamlet, it will not pass through the corresponding aperture in beamlet stop array 10, but instead will be blocked by the substrate of beamlet block array 10. But if beamlet blanker array 9 does not deflect a beamlet, then it will pass through the corresponding apertures in beamlet stop array 10 and will then be projected as a spot on a target surface 13 of the target 24. The target 24 is generally a substrate provided with a radiation-sensitive layer on top of its target surface 13. Examples of such substrate include, but are not limited to, a wafer and a mask.

The lithography system furthermore comprises a control unit 60 comprising data storage 61, a read out unit 62 and data converter 63. The control unit 60 may be located remote from the rest of the system, for instance outside the inner part of a clean room. Using optical fibers 64, modulated light beams holding pattern data are transmitted to a projector 65 which projects the ends of the fibers (schematically depicted in plate 15) into the electron optical unit 18, here on to the modulation array 9. Modulated light beams from each optical fiber end are projected on a light sensitive element on the beamlet blanker array 9. Each light beam 14 holds a part of the pattern data for controlling one or more modulators coupled to the light sensitive element.

Suitably, use is made of transmitting means 17 enabling that the projector 65 is appropriately aligned with the plate 15 at the ends of the fibers. A distance between the projector 65 and the light sensitive elements may vary. In one version, the projector 65 is located outside a virtual space column as defined by the distribution of the set of beamlets 7. This turns out suitable for minimizing disturbance of the beamlets 7. In order to project the light beam at the light sensitive element with a suitable incident angle, a mirror may be present between the projector 65 and the beamlet blanker array 9. In an alternative version, the projector may be present in the virtual space column near to the light sensitive elements 9. Such distance is suitably less than a cm, preferably in the order of mm or less. This prevents loss of light intensity while eliminating the need for assembly of the optical fibers to the light sensitive elements, and suitably thus the beamlet blanker array 9.

Subsequently, the electron beamlets 7 enter the end module. Hereinafter, the term 'beamlet' is used to refer to a modulated beamlet. Such a modulated beamlet effectively comprises time-wise sequential portions. Some of these sequential portions may have a lower intensity and preferably have zero intensity—i.e. portions stopped at the beam stop. Some portions will have zero intensity in order to allow positioning of the beamlet to a starting position for a subsequent scanning period.

In the shown embodiment, the end module comprises a beam stop array 10, a scanning deflector array 11, and a projection lens arrangement 12, although not all of these need be included in the end module and they may be arranged differently. The end module will, amongst other functions, provide a demagnification of about 100 to 500 times, preferably as large as possible, e.g. in the range 300 to 500 times. The end module preferably deflects the beamlets as described below. After leaving the end module, the beamlets 7 impinge on a target surface 13 positioned at a target plane. For lithography applications, the target usually comprises a wafer provided with a charged-particle sensitive layer or resist layer.

After passing the beamlet stop array 10, the thus modulated beamlets 7 pass through a scanning deflector array 11 that provides for deflection of each beamlet 7 in the X- and/or Y-direction, substantially perpendicular to the direction of the undeflected beamlets 7. In this invention, the deflector array 11 is a scanning electrostatic deflector enabling the application of relatively small driving voltages, as will be explained hereinafter. Next, the beamlets 21 pass through projection lens arrangement 12 and are projected onto a target surface 13 of a target, typically a wafer, in a target plane. The projection lens arrangement 12 focuses the beamlet, preferably resulting in a geometric spot size of about 10 to 30 nanometers in diameter.

The projection lens arrangement 12 in such a design preferably provides a demagnification of about 100 to 500 times. In this preferred embodiment, the projection lens arrangement 12 is advantageously located close to the target surface 13. In other embodiments, beam protector may be located between the target surface 13 and the focusing projection lens arrangement 12. The beam protector may be a foil or a plate, evidently provided with needed apertures, and are to absorb the released resist particles before they can reach any of the sensitive elements in the lithography system. Alternatively or additionally, the scanning deflection array 9 may be provided between the projection lens arrangement 12 and the target surface 13.

Roughly speaking, the projection lens arrangement 12 focuses the beamlets 7 to the target surface 13. Therewith, it further ensures that the spot size of a single pixel is correct. The scanning deflector 11 deflects the beamlets 7 over the target surface 13. Therewith, it needs to ensure that the position of a pixel on the target surface 13 is correct on a microscale. Particularly, the operation of the scanning deflector 11 needs to ensure that a pixel fits well into a grid of pixels which ultimately constitutes the pattern on the target surface 13. It will be understood that the macroscale positioning of the pixel on the target surface is suitably enabled by wafer positioning means present below the target 13.

Such high-quality projection is relevant to obtain a lithography system that provides a reproducible result. Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. Moreover, many of such lithography systems make use of a plurality of beamlets. No difference in irradiation ought to result from deflection steps.

Figure 2:
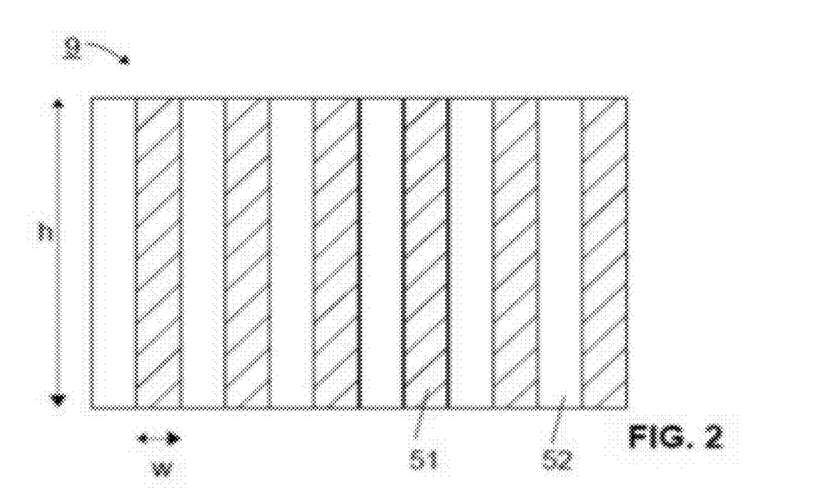
FIG. 2 shows a simplified, schematic view of the beamlet blanker array.
Figure 7:
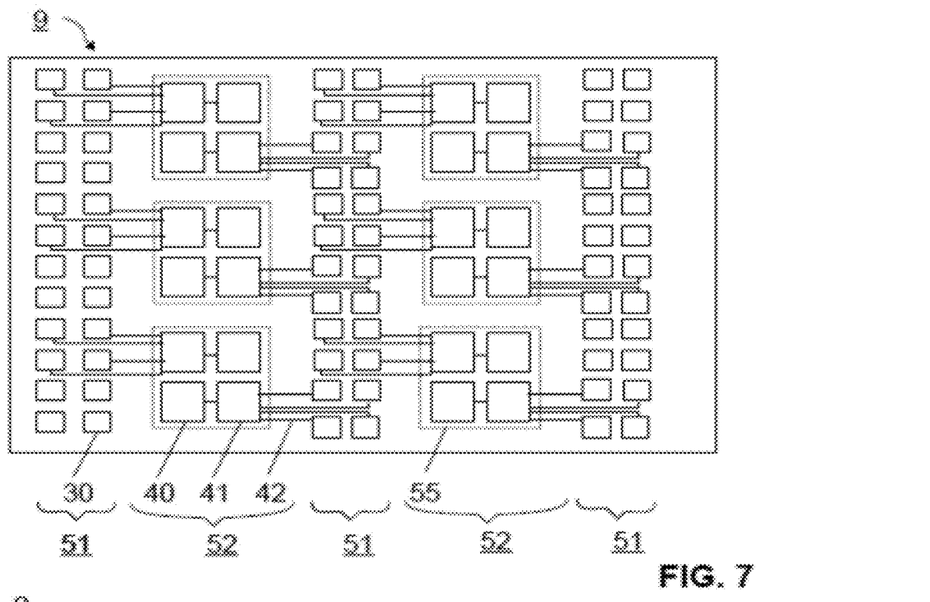
FIG. 7 shows a simplified top view of the beamlet blanker in one architecture.
Figure 8:
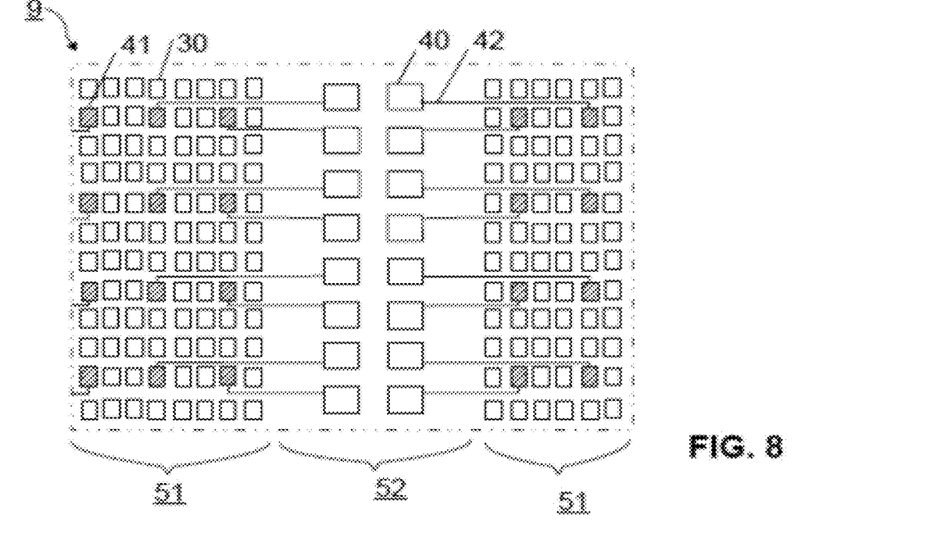
FIG. 8 shows a simplified top view of the beamlet blanker array in one implementation.

FIG. 2 shows a simplified, schematic view of the beamlet blanker array 9. FIG. 2 effectively mere shows the key design features. FIGS. 7 and 8 show simplified top views of the beamlet blanker array 9 in different implementations. In these FIGS. 7 & 8, only a portion of the beamlet blanker array 9 is shown.

FIG. 2 specifically shows the subdivision of the beamlet blanker array 9 into beam areas 51 and non-beam areas 52. Shown here is a representation for one subfield, that typically has a height h between 15 and 30 mm, for instance about 27 mm, and a width with corresponding dimensions. The width of a beam area 51 is for instance about 1.5 mm, but can be varied to any appropriate value, for instance in a range between 0.1 and 5 mm.

Figure 3A:
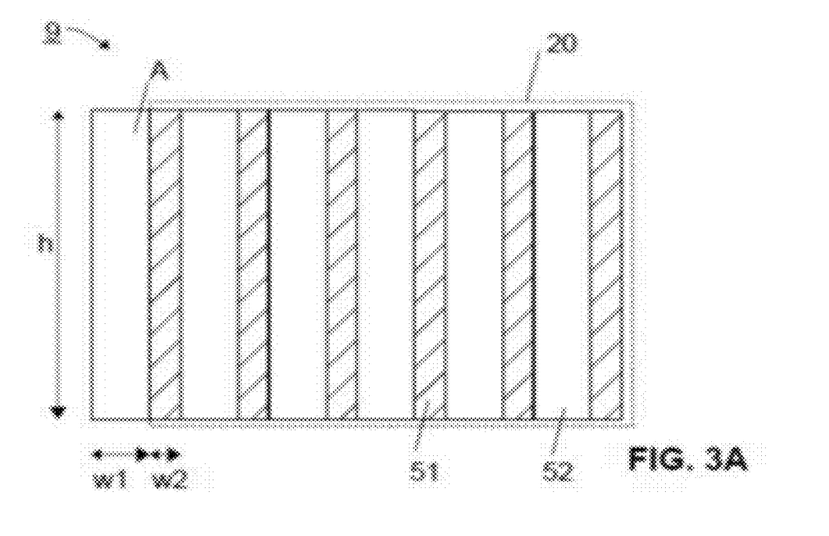
FIG. 3A shows another simplified, schematic view of the beamlet blanker array in a different layout.

FIG. 3A shows another simplified, schematic view of the beamlet blanker array in a different layout. Here again beamlet blanker array 9 is subdivided into areas 51 and non-beam areas 52. Shown again is a representation for one subfield, that typically has a height h between 15 and 30 mm, for instance approximately 27 mm. The width w2 of beam area 51 is now smaller than width w1 of non-beam area 52. Widths w1 and w2 can be varied to any appropriate value, for instance in a range between 0.1 mm and 5 mm, and may be chosen for resulting in an optimal distribution between beam and non-beam area. Preferably, width w1 of beam area 51 is approximately 2 mm and width w2 of non-beam area 52 is approximately 4 mm. In this embodiment, the wafer is mechanically scanned in a direction perpendicular to the main direction of the beam and non-beam areas.

Also schematically shown in FIG. 3A is the projection area 20, which may have dimensions of up to 27 mm×27 mm but other arrangements are also possible. In FIG. 3A, the first non-beam area A is shown to be placed outside projection area 20.

This allows for maximizing the space available for beam areas whilst at the same time realizing non-beam areas that are larger in area than the beam areas.

Figure 3B:
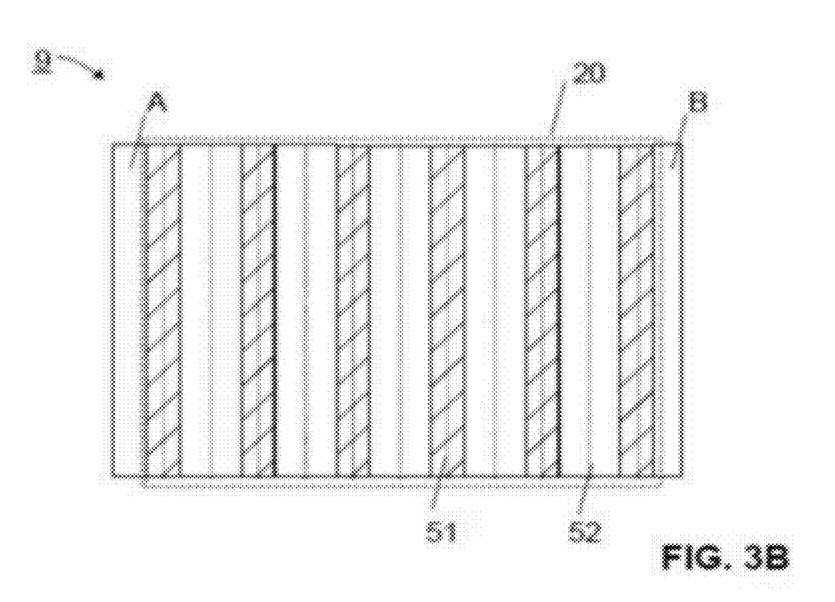
FIG. 3B shows a further simplified, schematic view of the beamlet blanker array in a different layout.

FIG. 3B shows an advantageous variant of the previously shown layout. In this layout, each beam area 51 and non-beam area 52 are functionally divided into two halves. Here, a halve non-beam area is arranged to serve the adjacent beam area. An entire non-beam area will thus serve two separate halve beam areas, located on either side of the non-beam area. Thus, the modulators in the beam area are controlled by light sensitive elements in the non-beam areas located on more than one side. In FIG. 3B, the first non-beam area A and the last non-beam area B are also placed outside projection area 20. Again, this allows for maximizing the space available for beam areas. However, the entire array may also be placed inside projection area 20.

Figure 4:
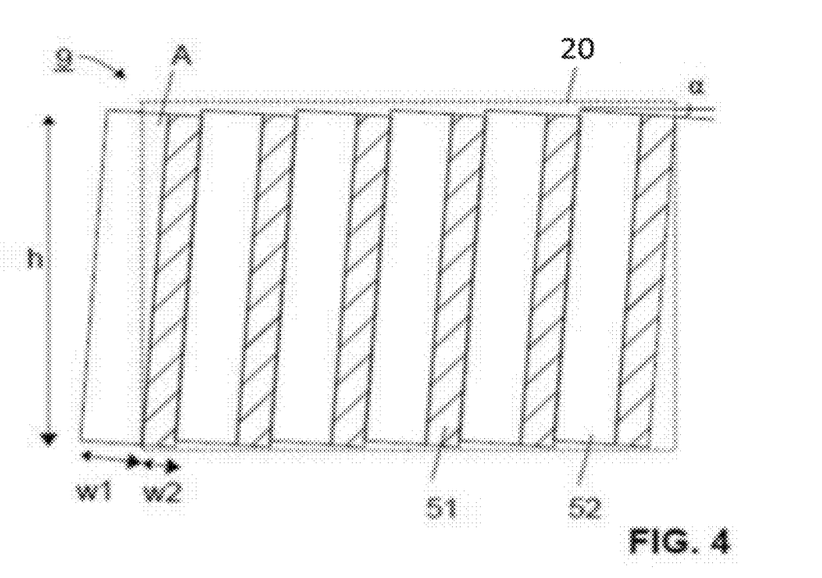
FIG. 4 shows a further simplified, schematic view of the beamlet blanker array in a different layout.

FIG. 4 shows another simplified, schematic view of the beamlet blanker array in a different layout. Here again beamlet blanker array 9 is subdivided into areas 51 and non-beam areas 52. Shown again is a representation for one subfield, that typically has a height h between 15 and 30 mm, for instance approximately 27 mm. The width w2 of beam area 51 is again smaller than width w1 of non-beam area 52.

For effectively an even greater reduction in pitch between the individual modulators in the beam area, the beam areas 51 and non-beam areas 52 are not placed exactly perpendicular to the mechanical scan direction but are rotated over a small angle α with regard to the mechanical scan direction. The rotation angle α can be small, suitably less than 5 degrees, more suitably less than 1 degree. From a side projection the modulators will appear to be closer together. This has the effect of reducing the pitch of the individual beams when projected on a target. In this embodiment, the wafer is again mechanically scanned in a direction perpendicular to the main direction of the beam and non-beam areas. In the mechanical scan direction the projection area (not shown in this figure) will still be completely covered in this layout and one non-beam area may still be placed largely outside the projection area.

For allowing continuous projection of features, the beam and non-beam areas are placed in a stepped and configuration, allowing a feature to be written by beams from several beam 51 areas in succession, whilst assuring that no gaps in the pattern to be written occur.

Also schematically shown in FIG. 4 is the projection area 20, which may have dimensions of up to 27 mm×27 mm but other arrangements are also possible. In FIG. 4, the first non-beam area A is shown to be partly placed outside projection area 20. A significant portion of the non-beam area A is placed outside projection area 20. This allows for maximizing the space available for beam areas whilst at the same time realizing non-beam areas that are larger in area than the beam areas.

Figure 4A:
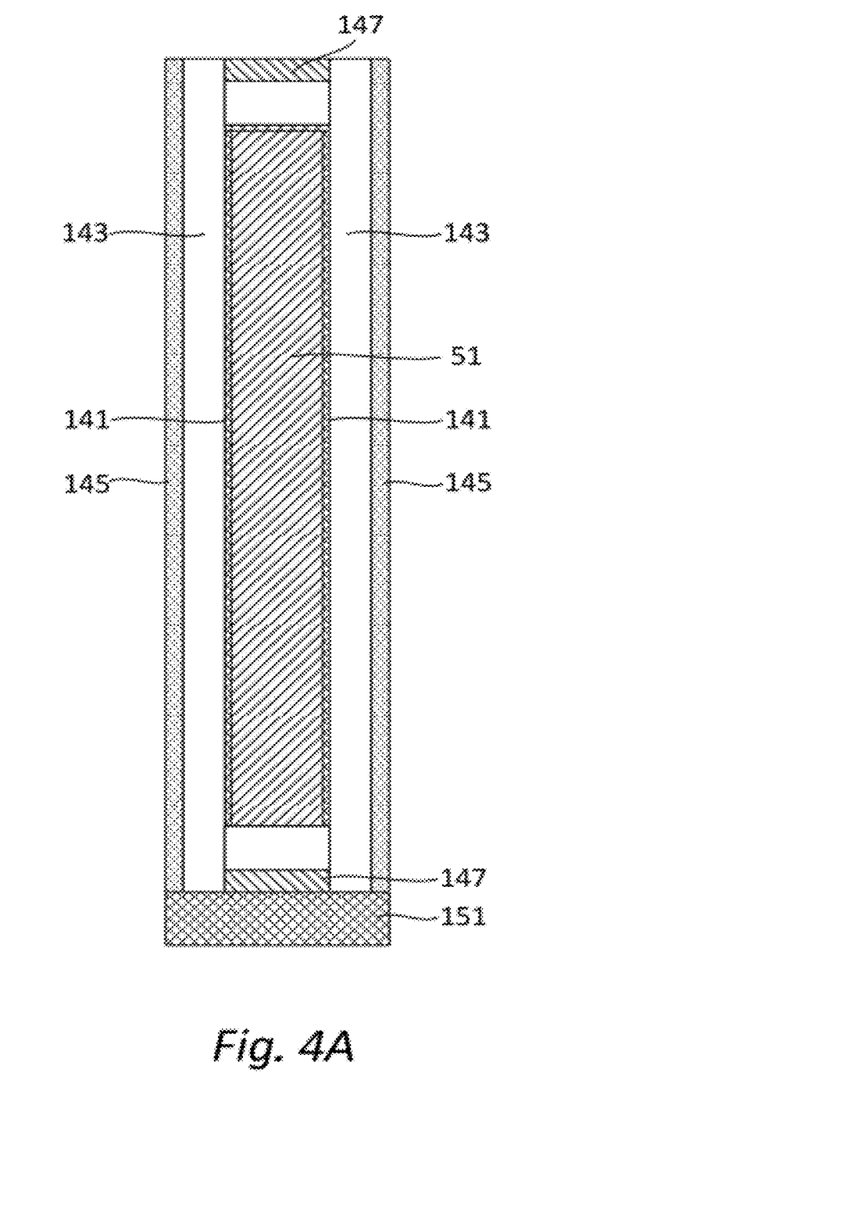
FIG. 4A schematically shows a top view of a more detailed lay-out of a portion of an embodiment of a beamlet blanker array.

FIG. 4A schematically shows a top view of a more detailed lay-out of a portion of an embodiment of a beamlet blanker array, for example the beamlet blanker array 9 shown in FIG. 3A, 3B or 4. The blanker array portion includes a beam area 51 surrounded by an area reserved for a shielding structure 141. The beamlet blanker array further includes a non-beam area, which effectively is all the space that is not reserved for the beam area 51 and the shielding structure 141. The shielding structure 141 is arranged to substantially shield electric fields that are externally generated, for example in the proximity of light sensitive elements, such as photodiodes, within the non-beam areas.

The shielding structure 141 can be described as comprising side walls forming an open-ended box-like structure. Note that the shielding structure 141 is not necessarily physically connected to the beamlet blanker array. If located within sufficiently close distance of the beamlet blanker array the shielding structure 141 can still sufficiently shield electric fields.

Materials suitable for the shielding structure 141 are materials with sufficiently high electric conductivity. Additionally, the material should have sufficient strength and workability. An exemplary suitable material for use as main component of the shielding structure is titanium (Ti). Other exemplary materials that may be used include molybdenum (Mo) and aluminum (Al). In an exemplary embodiment, the shielding structure is made using Ti-plates coated with Mo. In another exemplary embodiment the shielding structure includes a stack of Mo sheets with Al spacers.

The beamlet blanker array portion of FIG. 4A further includes an optical interface area 143 reserved for establishing an optical interface between a plurality of optical fibers and light sensitive elements within the beamlet blanker array. The optical fibers are arranged for guiding the modulated light beams towards the light sensitive elements within a non-beam area. The light sensitive elements, such as photodiodes, are thus placed within the optical interface area 143. The optical fibers may cover the entire optical interface area 143 or a portion thereof. The optical fibers are suitably arranged so that they do not physically block electron beamlets within the beam area 51 during use of the lithography system.

Additionally, the non-beam area of the beamlet blanker array includes a power interface area 145. The power interface area 145 is arranged to accommodate a power arrangement for suitably powering the light sensitive elements, and optionally other components, within the optical interface area 143. The power arrangement 145 may extend in a direction substantially perpendicular to, and away from the blanker array. Such arrangement 145 may enable the spread of the power lines over a large surface area, which improves the efficiency and reduces losses, e.g. due to a reduced thermal resistance caused by an increased radiation surface area. An example of a power arrangement 145 is a slab, i.e. a structure which can be described as a flattened electric wire.

The position of the power interface area 145 on the sides of the optical interface area 143 enables the use of relatively short power supply lines to the light sensitive elements. Consequently, the variation in voltage drop between different power lines, i.e. connections with nearby light sensitive elements versus connections with light sensitive elements further away, can be reduced.

The power arrangement placed accommodated by the interface area 145 is arranged for connection with a power supply 151. Preferably, the power supply 151 is provided at or in proximity of a short end of the beam area 51. In case of a plurality of alternating beam areas 51 and non-beam areas, for example as shown in FIGS. 2, 3A, 3B and 4, the power supply 151 may extend along the short ends of these areas.

The non-beam area may further include an additional interface area 147 to enable the accommodation of further circuitry, for example a clock and/or a control. The power arrangement within the power interface area 145 may also be arranged to provide sufficient power to the additional interface area 147.

Although FIG. 4A schematically shows a very specific lay-out of the several areas, it will be understood that it is possible to have a different lay-out. Similarly, the size and shape of the different interface areas may vary in dependence of the specific application.

Figure 5:
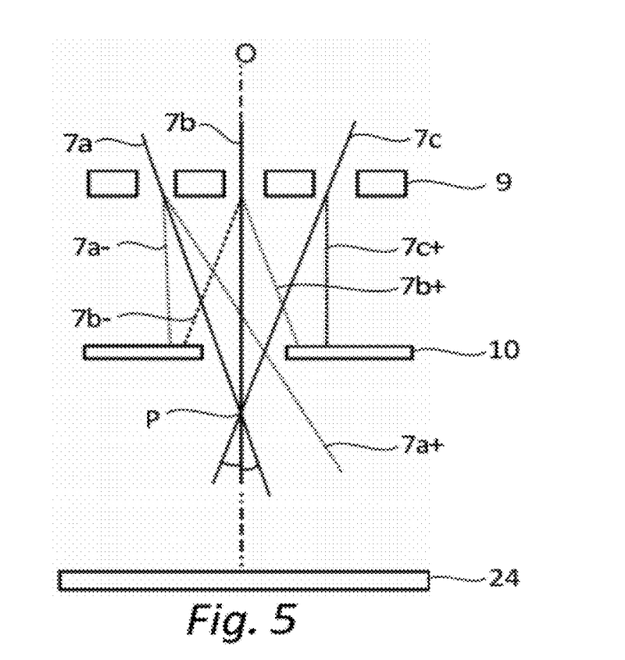
FIG. 5 shows diagrammatically the operation of the blanker arrangement.

FIG. 5 shows a schematic diagram of a blanker 8. It is more precisely a cross-sectional drawing in a vertical plane extending through the blanker. The blanker comprises a blanker array 9 with a plurality of apertures 35, and a beam stop array 10. For sake of reference the target 24 has also been indicated. The figure is not drawn to scale. For sake of clarity, only a section of the array 9 is indicated, including apertures 35 for beamlets 7a, 7b and 7c. These beamlets 7a, 7b, 7c form part of one group that may be generated from a beam from a single source or from a single subbeam. The present blanker 8 is designed for a system comprising a beamlet manipulator for converging groups of beamlets 7a, 7b, 7c towards a common point of convergence P for each group. This common point of convergence P is located on an optical axis O for the group of beamlets 7a, 7b, 7c. As a result of beam manipulating in the beam manipulator, the beamlets 7a, 7c are converging. These beamlets 7a, 7c have an incident angle $\alpha$, $\gamma$ extending between the beamlet ray and the optical axis O. The dashed lines 7a−, 7a+, 7b+, 7c− show orientations of the beamlets 7a, 7b, 7c, when these beamlets are deflected in the blanking deflectors of the blanking array 9. Beamlet 7c is herein deflected backwards into orientation 7c−; that is its incident angle $\gamma$ is reduced by the operation of the blanking deflector 30. Beamlet 7b is effectively deflected forwards into direction 7b+. Therewith, beamlets 7b and 7c are deflected in mutually opposite directions, at least in the plane of this figure. For beamlet 7a, two deflection directions are shown, the backwards direction 7a− and the further forward direction 7a+. In this example, the further forward direction 7a+ would pass the beam stop array 10 and is therefore not appropriate. The backwards direction 7a− is therefore applied.

Figure 6:
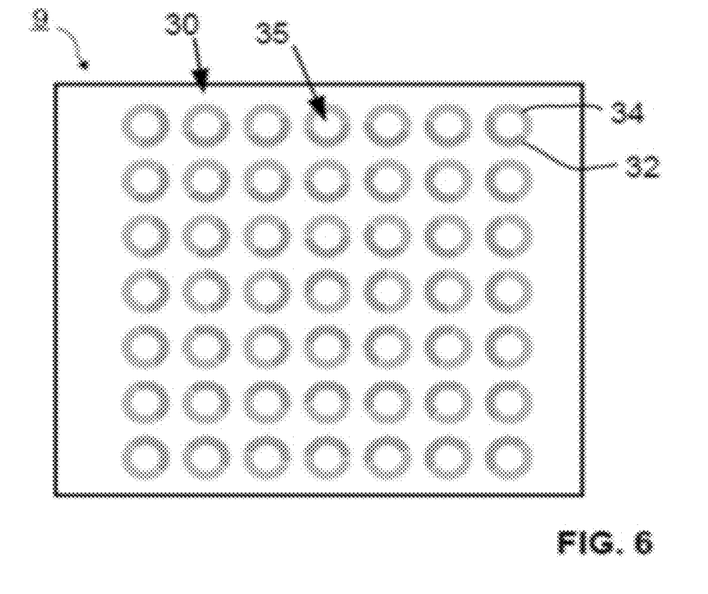
FIG. 6 shows a configuration of the electrodes in the blanker arrangement.

FIG. 6 shows a first configuration of the deflector 30. The deflector 30 is preferably an electrostatic deflector with a first electrode 32 and a second electrode 34. This view shows an arrangement of the individual deflectors 30. FIG. 6 shows furthermore that the deflectors 30 comprise at least one concave electrode 32 or 34. Suitably, as in this embodiment, both electrodes 32, 34 have a concave shape. Apertures 35 extend through the blanker array 9 between the electrodes 32, 34. The concave shape results in the electrodes 32, 34 having a shape that is conformal to cylindrical apertures 35. This cylindrical aperture shape is in itself suitable for preventing the introduction of certain optical aberrations, such as astigmatism. By carefully choosing the layout and deflection direction the deflection of the beamlets can be spread out in all directions, preventing undesirable buildup of charge in specific locations.

FIG. 7 shows a simplified top view of the beamlet blanker array 9 in one architecture of the present invention. The beamlet blanker array 9 comprises herein both individual blankers 30—also referred to as deflectors—and light sensitive elements 40. In this embodiment, the beamlet blanker array 9 is subdivided into beam areas 51 and non-beam areas 52. Both the beam areas 51 and the non-beam areas 52 are located within a virtual space column, e.g. the area defined by the distribution of the beamlets 7. The light sensitive elements 40 are located in the non-beam areas 52. Photodiodes and phototransistors are suitable examples of light sensitive elements 40. An optical waveguide may be present on top of the light sensitive elements to improve such incoupling of the light beams. Preferably, an antireflection coating is present on top of the light sensitive element 40. This at least substantially prevents reduction of light intensity due to reflections. In this embodiment, the number of light sensitive elements 40 is lower than the number of deflectors 30. Signals transmitted through the optical fibers are thereto first multiplexed, and again demultiplexed in a demultiplexer 41 after reception in the light sensitive elements 40. The demultiplexed signals are transmitted with interconnects 42 to the individual deflectors 30. These deflectors are thereto suitably arranged in an array of deflectors having columns and rows. Such array-wise addressing reduces the number of interconnects 42 extending from the demultiplexer 41 to the deflectors 30. While the current embodiment shows four deflectors 30 per light sensitive element 40, a ratio between deflectors 30 and light sensitive elements 40 may be increased up to 100 or even more, for instance 250. The need for reduction of interconnects 42 becomes then apparent. Additionally, the array-wise addressing particularly reduces area in the beam area 51 and/or mutual influencing of interconnects 42 to different deflectors 30. In order to ensure that such deflectors 30 deflect a passing beamlet 7 during a full deflection period, a memory element is preferably available. A control signal is then stored in the memory element for a period at least corresponding to the full deflection period. Thus, the control signal can be transmitted as short light pulses. An additional advantage of this arrangement is that the deflection step becomes time-wisely independent from the transmission of control signals. The transmission of control signals may thus be done sequentially, whereas the deflection of beamlets occurs simultaneously. The beam protector 55 of this embodiment may be embodied as a plate assembled substantially parallel to the substrate of the blanker array 9. Alternatively, it may be embodied as a side wall extending from the substrate. It is in both cases a structure extending, when viewed in a perpendicular projection of the beam protector 55 on the substrate, laterally around the one or one group of light sensitive elements 40.

FIG. 7 shows the layout as shown previously in schematic form in FIGS. 3A, 3B, but the beam blanker array according to FIG. 7 may also be implemented in the rotated and stepped configuration of FIG. 4.

FIG. 8 shows a simplified top view of the beamlet blanker array 9 comprising a plurality of beam areas 51 and non-beam areas 52. The present figure merely shows a portion of the array. The light sensitive elements 40 are here positioned in the non-beam area 52. Signals are transmitted from a light sensitive element 40 to a demultiplexer 41 via interconnect 42. Positioning of the demultiplexer 41 within the beam area 51 reduces the number of interconnects 42, particularly those with a relatively long extension from the non-beam area 52 into the beam area 51. The demultiplexer 41 is schematically shown here in the center of a 3×3 array of deflectors 30. That is a purely diagrammatical figure and is not intended to suggest that the center deflector 30 is replaced by the demultiplexer 41. In fact, it is more likely that the demultiplexer 41 is located between individual deflectors 30, at an edge of the 3×3 array or at any otherwise lost area.

Figure 9A:
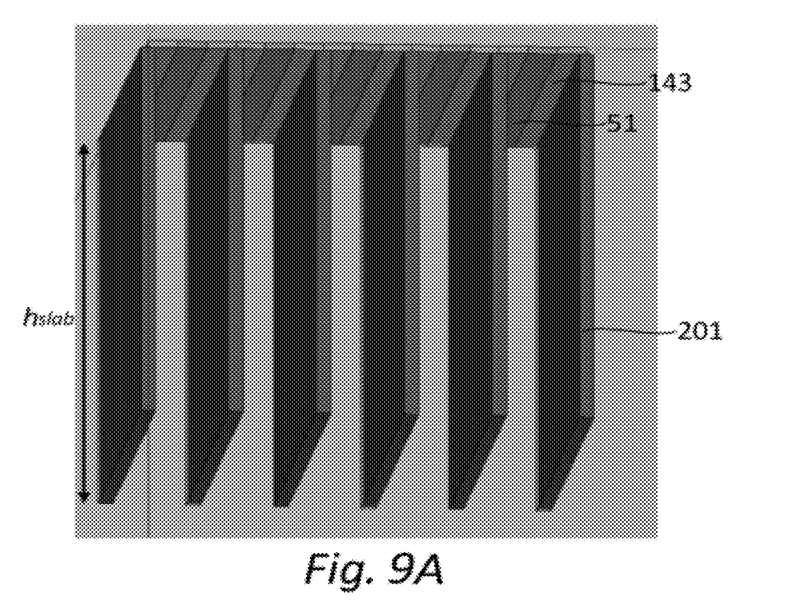
FIGS. 9A, 9B show examples of a power arrangement comprising a slab.
Figure 9B:
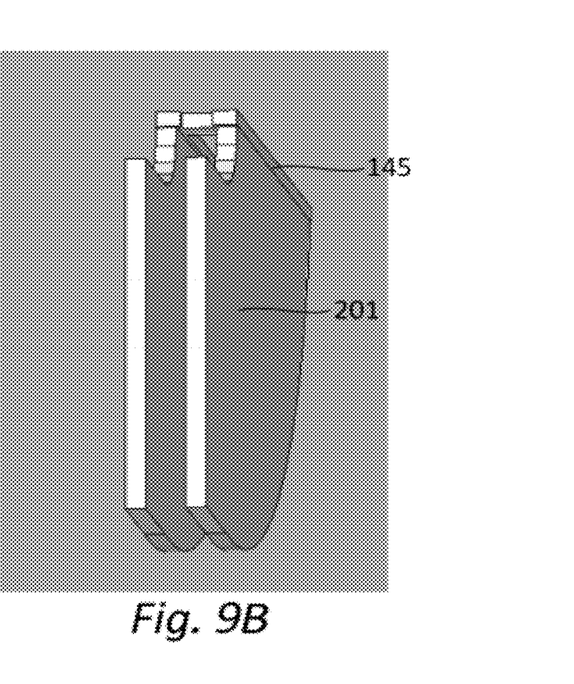

FIGS. 9A, 9B show examples of a power arrangement comprising a slab 201. The slab is made of an electrically conductive material, for example copper. The slab 201 in FIG. 9A takes the form of a flattened electrically conductive structure with a substantially rectangular shape. The slab 201 has a long side running parallel to the long direction of the power interface area. One of the long sides of the slab is connected to the power interface area. At least one of the short sides of the slab 201 may be connected to a power supply. The use of a slab 201 in this way provides a manner of supplying power in a well distributed manner.

Instead of a rectangular structure, the slab may have a fixed width throughout the trajectory between the side at which connection is made with the power interface area 145 and the opposing side connected to the power supply. It can be readily understood, that instead of a slab 201, in this case a ribbon cable, i.e. a ribbon comprising a plurality of parallel electrically conducting cables, may be used as well. Preferably, the slab 201 has a height $h_{slab}$ that is equal to or greater than the long side of the beam area 51. Such height reduces impedance and reduces potential variations.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A charged particle lithography system for transferring a pattern onto the surface of a target, comprising:
   a beam generator for generating a plurality of charged particle beamlets, the plurality of beamlets defining a column;
   a beam stop array having a surface for blocking beamlets from reaching the target surface and an array of apertures in the surface for allowing the beamlets to reach the target surface; and
   a modulation device for modulating the beamlets to prevent one or more of the beamlets from reaching the target surface or allow one or more of the beamlets to reach the target surface, by deflecting or not deflecting the beamlets so that the beamlets are blocked or not blocked by the beam stop array, the modulation device comprising:
      a plurality of apertures arranged in arrays for letting the beamlets pass through the modulation device;
      a plurality of modulators associated with the plurality of apertures, each modulator being provided with electrodes extending on opposing sides of an associated aperture for generating an electric field across the aperture; and
      a plurality of light sensitive elements arranged in arrays, for receiving modulated light beams and converting the light beams into electric signals for actuating the modulators;
   wherein a surface area of the modulation device comprises an elongated beam area comprising an array of apertures and associated modulators, and a power interface area for accommodating a power arrangement for suitably powering elements within the modulation device, the power interface area being located alongside a long side of the elongated beam area and extending in a direction substantially parallel thereto.

2. The system according to claim 1, wherein the power interface area extends along the entire length of the long side of the elongated beam area.

3. The system according to claim 1, wherein the power interface area comprises a first portion positioned alongside a first long side of the elongated beam area and extending in a direction substantially parallel thereto, and a second portion alongside a second long side of the elongated beam area and extending in a direction substantially parallel thereto, the second long side being opposite to the first long side.

4. The system according to claim 1, wherein the surface area of the modulation device further comprises an optical interface area in which the light sensitive elements are placed, and the power arrangement is arranged for suitably powering the light sensitive elements.

5. The system according to claim 4, wherein the optical interface area has an elongated shape, and wherein the optical interface area is located between the beam area and the power interface area.

6. The system according to claim 4, further comprising a plurality of optical fibers for guiding the modulated light beams towards the light sensitive elements, wherein the optical interface area being reserved for establishing an optical interface between the plurality of optical fibers and the light sensitive elements.

7. The system according to claim 1, wherein the power arrangement extends in a direction substantially perpendicular to, and away from the modulation device.

8. The system according to claim 7, further comprising a power supply, the power supply being located at a short side of the power interface area, the power arrangement being connected to the power supply.

9. The system according to claim 8, wherein a projection of the power arrangement in a direction substantially perpendicular to the surface of the modulation device falls entirely within the power interface area.

10. The system according to claim 1, wherein the power arrangement comprises a ribbon cable.

11. The system according to claim 1, wherein the power arrangement comprises a slab.

12. The system according to claim 11, wherein the slab has a height that is equal to or greater than the long side of the beam area.

13. The system according to claim 1, wherein the long side of the beam area extends over substantially an entire width of the beamlet column.

14. The system according to claim 1, further comprising a wafer positioning system arranged for moving the target in a predetermined direction relative to the modulation device, and wherein the orientation of the long side of the beam area is substantially transverse to a relative direction of movement of the wafer positioning system.

15. The system according to claim 1, further comprising a wafer positioning system arranged for moving the target in a predetermined direction relative to the modulation device, and wherein the long side of the beam area has a skewed orientation with respect to the predetermined direction of movement between the wafer positioning system and the modulation device.

16. The system according to claim 15, wherein the slit has an orientation at an angle of less than 5 degrees with respect to a direction perpendicular to the predetermined direction of movement between the wafer positioning system and the modulation device.

17. The system according to claim 1, wherein the modulated light signals received by the light sensitive elements are multiplexed to provide information for controlling more than one modulator, and wherein each light sensitive element is communicatively coupled with a demultiplexer for demultiplexing the received signal for control of a plurality of modulators.

18. The system according to claim 1, wherein the light sensitive elements are arranged to provide a signal for controlling a plurality of the modulators, and wherein the modulation device further includes a plurality of memory elements, each memory element being arranged for storing a signal for control of one of the modulators.

19. The system according to claim 1, wherein the surface area of the modulation device is subdivided into a plurality of alternating beam areas and non-beam areas, the modulators being located in the beam areas, and the light sensitive elements being located in the non-beam areas;
wherein the light sensitive elements in the non-beam areas are communicatively coupled to the modulators in an adjacent beam area.

20. The system according to claim 19, wherein the modulators in a beam area are controllable by light sensitive elements arranged in non-beam areas located on more than one side of the beam area.

21. The system according to claim 19, wherein the modulators in the beam areas are more densely packed together than the light sensitive elements in the non-beam areas.

22. The system according to claim 19, wherein the beamlets are arranged in groups and the modulators are arranged in groups, each group of modulators for deflecting or not deflecting one of the groups of beamlets, and wherein each group of modulators is located in a single one of the beam areas of the modulation device.

23. The system according to claim 22, wherein each group of modulators is arranged in a rectangular array in one of the beam areas, and is controlled by a single light sensitive element in an adjacent non-beam area.

24. The system according to claim 22, wherein each group of modulators is arranged in a radial arrangement around a centrally located axis of the corresponding groups of beamlets.

25. The system according to claim 19, further including a shielding structure for shielding electric fields generated within the non-beam areas.

26. The system according to claim 25, wherein the shielding structure, or a projection thereof in a direction perpendicular to the surface of the modulation device, surrounds a beam area.

27. The system according to claim 25, wherein the shielding structure comprises side walls forming an open-ended box-like structure.

28. The system according to claim 1, wherein the modulators are part of a CMOS device.

29. The system according to claim 28, wherein electrodes of the modulators are formed by conductive layers of the CMOS device.

30. A modulation device for use in a charged particle lithography system for patterning a plurality of charged particle beamlets in accordance with a pattern, the beamlets defining a column, the modulation device serving to modulate the beamlets to prevent one or more of the beamlets from reaching the target surface or allow one or more of the beamlets to reach the target surface, by deflecting or not deflecting the beamlets, the modulation device comprising:
a plurality of apertures arranged in arrays for letting the beamlets pass through the modulation device and a plurality of modulators associated with the plurality of apertures, each modulator being provided with electrodes extending on opposing sides of an associated aperture for generating an electric field across the aperture; and
a plurality of light sensitive elements arranged in arrays, for receiving modulated light beams and converting the light beams into electric signals for actuating the modulators;
wherein a surface area of the modulation device comprises an elongated beam area comprising an array of apertures and associated modulators, and a power interface area for accommodating a power arrangement for suitably powering elements within the modulation device, the power interface area being located alongside a long side of the elongated beam area and extending in a direction substantially parallel thereto.

31. A method of transferring a pattern on to a target surface using a charged particle lithography system according to claim 1, the method comprising the steps of:
generating a plurality of beamlets defining a column;
modulating the beamlets by deflecting or not deflecting the beamlets, for the purpose of completely or partly preventing the beamlets from reaching the target surface, under control of a control unit;
transferring the passed beamlets to the target surface;
wherein the modulating further comprises the steps of:
optically transmitting data as modulated light beams carrying the pattern, to light sensitive elements;
converting the modulated light beams received by the light sensitive elements into electric signals;

actuating one or more modulators, on the basis of the electrical signals, to selectively deflect the beamlets for blocking or not blocking the beamlets from reaching the target surface, by means of deflection in an electric field.

* * * * *